United States Patent
Tsai

(10) Patent No.: US 10,804,413 B1
(45) Date of Patent: Oct. 13, 2020

(54) PACKAGE COMPONENT

(71) Applicant: KINGPAK Technology Inc., Hsinchu County (TW)

(72) Inventor: Yu-Hsuan Tsai, Hsinchu County (TW)

(73) Assignee: KINGPAK TECHNOLOGY INC, Zhubei, Hsinchu (TW)

( * ) Notice: Subject to any disclaimer, the term of this patent is extended or adjusted under 35 U.S.C. 154(b) by 0 days.

(21) Appl. No.: 16/729,842

(22) Filed: Dec. 30, 2019

(30) Foreign Application Priority Data

Aug. 7, 2019 (TW) .............................. 108128158 A

(51) Int. Cl.
  *H01L 31/0203* (2014.01)
  *B29C 35/08* (2006.01)
  *C09D 5/00* (2006.01)

(52) U.S. Cl.
  CPC ...... *H01L 31/0203* (2013.01); *B29C 35/0805* (2013.01); *C09D 5/006* (2013.01); *B29C 2035/0827* (2013.01)

(58) Field of Classification Search
  CPC ........ B29C 35/0805; B29C 2035/0827; H01L 31/0203; C09D 5/006
  USPC ....................................................... 250/239
  See application file for complete search history.

(56) References Cited

U.S. PATENT DOCUMENTS

| | | | |
|---|---|---|---|
| 7,335,533 B2 * | 2/2008 | Derderian ........... | H01L 25/0657 438/109 |
| RE46,903 E * | 6/2018 | Takachi ................ | G02B 5/282 |
| 2004/0080267 A1 * | 4/2004 | Cok ...................... | H01L 27/323 313/512 |
| 2009/0026372 A1 * | 1/2009 | Hayashi .............. | H01L 31/0203 250/338.4 |
| 2017/0213864 A1 * | 7/2017 | Chen ................. | H01L 27/14687 |

\* cited by examiner

*Primary Examiner* — Seung C Sohn
(74) *Attorney, Agent, or Firm* — McClure, Qualey & Rodack, LLP.

(57) ABSTRACT

A package component includes a base layer, a sensing layer, a photo-curable adhesive, a cover layer and a first filter structure. The photo-curable adhesive and the sensing layer are disposed on the base layer. The sensing layer includes a sensing unit surrounded by the photo-curable adhesive. The cover layer is disposed on the sensing layer. The first filter structure faces the photo-curable adhesive and is disposed on the cover layer. The first filter structure is configured for transmitting a curing light which is used to cure the photo-curable adhesive, and for reflecting a detectable light which is to be sensed by the sensing unit, where the wavelength of the curing light is different from the wavelength of the detectable light.

9 Claims, 3 Drawing Sheets

PACKAGE COMPONENT

CROSS-REFERENCE TO RELATED APPLICATION

This non-provisional application claims priority under 35 U.S.C. § 119(a) to Patent Application No. 108128158 filed in Taiwan, R.O.C. on Aug. 7, 2019, the entire contents of which are hereby incorporated by reference.

BACKGROUND

Technical Field

The present invention relates to a package component, and in particular, to a package component adapted to be sealed with a photo-curable adhesive.

Related Art

In an electronic package component, ultraviolet light curing epoxy (UV curing epoxy) can be used as a sealing adhesive. After the sealing adhesive is irradiated by ultraviolet light, the sealing adhesive is cured, and a package cavity having an accommodation space is thus formed above a substrate. Because the temperature of the required fabrication process is relatively low and the curing time is relatively short, the above sealing method can be widely used in package processes for encapsulating an enclosed cavity.

However, photosensitive units such as photo diodes disposed in a package cavity must be prevented from being exposed to ultraviolet light, to prevent photo diodes from deterioration and failing. Therefore, a filter layer having a character of anti-ultraviolet light needs to be configured on a surface of the package component. However, the filter layer may lower the transmittance of the ultraviolet light, which makes the UV curing epoxy incompletely cured, finally resulting in a failure of the package component.

SUMMARY

In each of the embodiments of the present invention, a package component is provided. Wherein, a filter structure corresponding to a sealing adhesive and disposed on a surface of a cover layer is mainly used, so that a curing light suitable for curing the sealing adhesive can pass through the filter structure from the perimeter of the cover layer and irradiate the sealing adhesive. Meanwhile, visible light incident from the periphery is reflected by the filter structure, thereby reducing intensity of the reflected light impinging on a photosensitive unit at the center, and hence reducing flare phenomena.

A package component of an embodiment of the present invention includes a base layer, a sensing layer, a photo-curable adhesive, a cover layer a first filter structure, and a second filter structure. The sensing layer and the photo-curable adhesive are disposed on the base layer. The sensing layer includes a sensing unit surrounded by the photo-curable adhesive. The cover layer is disposed above the sensing layer and hermetically connected to the base layer through the photo-curable adhesive. The first filter structure faces the photo-curable adhesive and is disposed on a surface of the cover layer. The first filter structure is configured for transmitting a curing light which is used to cure the photo-curable adhesive and for reflecting a detectable light which is to be sensed by the sensing unit, where the wavelength of the curing light is different from the wavelength of the detectable light. The second filter structure is corresponding to the sensing unit, and disposed on a surface of the cover layer. The second filter structure is configured for transmitting the detectable light and for reflecting the curing light.

It should be easier to understand the objective, technical content, features and effects that can be achieved of the present invention by describing the following in detail by specific embodiments with accompanying drawings.

DETAILED DESCRIPTION

Figure 1:
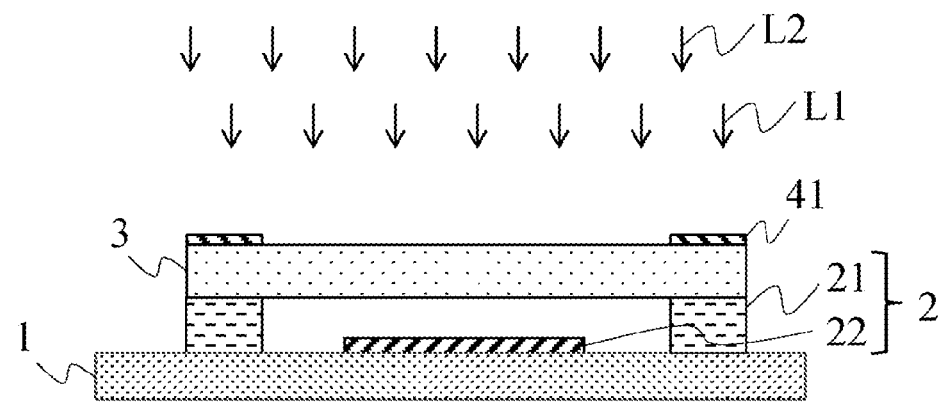
FIG. 1 is a schematic diagram showing a package component according to an embodiment of the present invention.

Each of embodiments of the present invention is described in detail below, and the drawings are used for exemplary purposes. In the description of the specification, for the purpose of giving the reader a more comprehensive understanding of the present invention, many specific details are provided. However, the present invention may still be implemented with the omission of some or all of the specific details. Identical or similar components in the drawings are represented by identical or similar symbols. It should be particularly noted that the drawings are for illustration purposes only and do not represent the actual size or number of the components, and some details may not be fully drawn for the simplicity of the drawings.

Referring to FIG. 1, a package component of an embodiment of the present invention includes a base layer 1, a sensing layer 2, a photo-curable adhesive 21, a cover layer 3 and a first filter structure 41. The base layer 1 may be an integrated circuit (IC) substrate, a silicon substrate, a PCB substrate or an electrically suitable carrier plate, for example, but not limited to, a substrate made of a material such as ceramic, polymer, semiconductor, or metal. The sensing layer 2 includes a sensing unit 22, the photo-curable adhesive 21 and the sensing unit 22 are disposed on the base layer 1, and the photo-curable adhesive 21 surrounds the sensing unit 22. For example, the sensing unit 22 is adhered to a central area of the base layer 1 through a die-bonding process, and then the photo-curable adhesive 21 is disposed on a perimeter of the base layer 1 through a dispensing process or a coating process so as to be spaced apart from the sensing unit 22 by an appropriate distance.

In an embodiment, the sensing unit 22 may be, but is not limited to, a photoelectric sensor or a thermal sensor. For example, the photoelectric sensor may be a complementary metal oxide semiconductor (CMOS), a photo diode or a charge-coupled device (CCD); and the thermal sensor may be one of a bolometer, a thermopile and a pyroelectric detector, but is not limited to the foregoing.

The cover layer 3 is disposed above the sensing layer 2. The cover layer 3 is hermetically connected to the base layer 1 through the photo-curable adhesive 21, thereby forming a package cavity to accommodate the sensing unit 22. In an embodiment, the cover layer 3 is a glass substrate or a substrate made of a light-permeable material. As shown in FIG. 1, the cover layer 3 has a light entrance surface receiving a curing light L1 and a detectable light L2, and a light exit surface facing the base layer 1. Wherein, the light entrance surface and the light exit surface are opposite to each other and partially available for light to propagate or reflect. For example, as for the cover layer 3 whose surfaces have not been coated or plated, ultraviolet light (that is, the curing light L1) and visible light (that is, the detectable light L2) can both propagate through the light entrance surface of the cover layer 3 and leave from the light exit surface, to irradiate the sensing unit 22 of the sensing layer 2. Herein, the wavelength of the curing light L1 (that is, ultraviolet light) is different from the wavelength of the detectable light L2 (that is, visible light). However, it is found by the inventor that a deterioration or failure issue of the sensing unit 22 may easily occur once the sensing unit 22 is continuously exposed in ultraviolet light (that is, the curing light L1), making the lifetime of the sensing unit 22 shortened. Therefore, some improved structures are provided and recited in the following embodiments.

Figure 2:
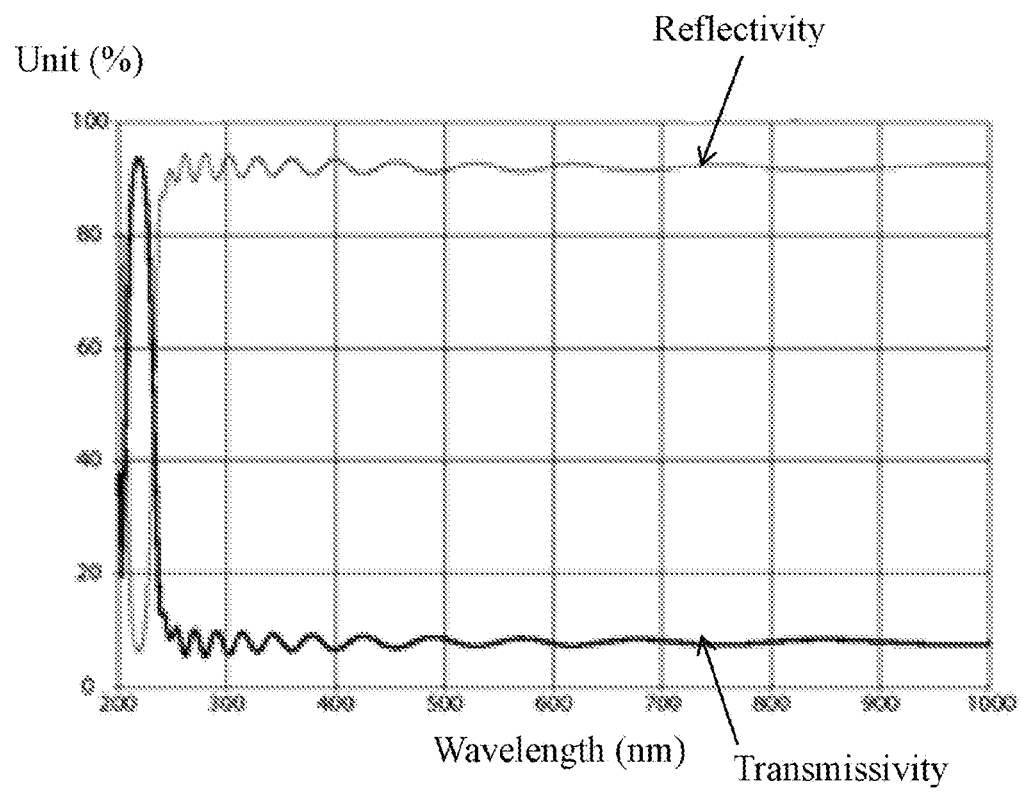
FIG. 2 is a schematic diagram showing optical properties of a first filter structure according to an embodiment of the present invention.

Referring to FIG. 1 and FIG. 2, in this embodiment, the first filter structure 41 corresponds to the photo-curable adhesive 21 and is disposed on the light entrance surface of the cover layer 3. For example, the first filter structure 41 can form a ring-shaped coating layer on the perimeter of the light entrance surface of the cover layer 3 through, for example, but is not limited to, an evaporation process, but this embodiment is not limited thereto. In other words, the first filter structure 41 is disposed on the perimeter of the cover layer 3, the photo-curable adhesive 21 is disposed on the perimeter of the base layer 1, and an orthogonal projection of the first filter structure 41 onto the base layer 1 overlaps with or at least partially overlaps with an orthogonal projection of the photo-curable adhesive 21 onto the base layer 1. In this way, the first filter structure 41 can allow the curing light L1 to propagate through the cover layer 3 so as to irradiate the photo-curable adhesive 21 from a roughly orthogonal direction. For example, ultraviolet light (that is, the curing light L1) propagates through the first filter structure 41 and the light entrance surface of the cover layer 3, and then emerges from the light exit surface of the cover layer 3 to impinge on the UV curing epoxy. As a result, the UV curing epoxy is cured to hermetically connect the cover layer 3 with the base layer 1. It comes out that a solid package cavity is built and possibility for the package component to be cracked or damaged in the future is thereby reduced.

Specifically, the first filter structure 41 is designed for the curing light L1 to pass through it at the perimeter of the first filter structure 41 from a roughly orthogonal direction, and then to irradiate the photo-curable adhesive 21. The wavelength (or light frequency) of the curing light L1 corresponds to a process window of the photo-curable adhesive 21. In other words, once the photo-curable adhesive 21 is irradiated by the curing light L1, the photo-curable adhesive 21 starts to be cured and gradually transforms from a fluid state to a solid state. After being thoroughly irradiated, the photo-curable adhesive 21 is fully cured. Thus, the photo-curable adhesive 21 can firmly connect the base layer 1 with the cover layer 3, thereby forming an enclosed package cavity as mentioned above. In an embodiment, the photo-curable adhesive 21 is an ultraviolet-curable adhesive, and correspondingly, the wavelength of the curing light L1 falls within the ultraviolet light (UV light) band. Referring to FIG. 2, in this embodiment, the transmittance of the curing light L1 relative to the first filter structure 41 is greater than 90% (referring to an upper thin line shown in FIG. 2). Therefore, the curing light L1 propagates through the first filter structure 41 and irradiates the photo-curable adhesive 21, so that the photo-curable adhesive 21 is stably connected between the base layer 1 and the cover layer 3. Moreover, a solid package cavity is formed, and a physical structure of the sensing unit 22 inside the package cavity is protected.

Meanwhile, the first filter structure 41 on the cover layer 3 can reflect the detectable light L2 from the periphery, and prevent the obliquely incident detectable light L2 from impinging onto the sensing unit 22 at the center of the base layer 1. By this way, flare phenomena can be mitigated. In this embodiment, the first filter structure 41 can reflect the detectable light L2, and the wavelength (or light frequency) of the detectable light L2 corresponds to a process window of the sensing unit 22. For example, the wavelength of the detectable light L2 falls within the visible light band, and the sensing unit 22 is a charge-coupled device, configured to capture images outside the package component. In an embodiment, the charge-coupled device generates an electrical signal after being irradiated by visible light, so as to sense images, but this embodiment is not limited thereto. Referring to FIG. 2, in this embodiment, the reflectance of the detectable light L2 relative to the first filter structure 41 is greater than 90% (referring to a lower thick line shown in FIG. 2). Therefore, the detectable light L2 cannot propagate through the first filter structure 41, or only a very little portion of the detectable light L2 could pass through the first filter structure 41, which further prevents the sensing unit 22 from being irradiated by obliquely incident light and can reduce or eliminate flare issue.

According to the foregoing structure, the first filter structure 41 is disposed at an appropriate location of the cover layer 3. The appropriate location means that the orthogonal projection of the first filter structure 41 onto the base layer 1 roughly or at least partially overlaps with the orthogonal projection of the photo-curable adhesive 21 onto the base layer 1, so that the curing light L1 can propagate through the cover layer 3 to have the photo-curable adhesive 21 fully cured, thereby avoiding cracking or lifetime reduction of the package component due to poor curing quality. Meanwhile, the first filter structure 41 reflects the detectable light L2, to avoid or reduce the extant that the sensing light L2 is obliquely incident onto the sensing unit 22 at the center of the base layer 1, so as to avoid or mitigate the flare issue of the sensing unit 22.

Figure 3:
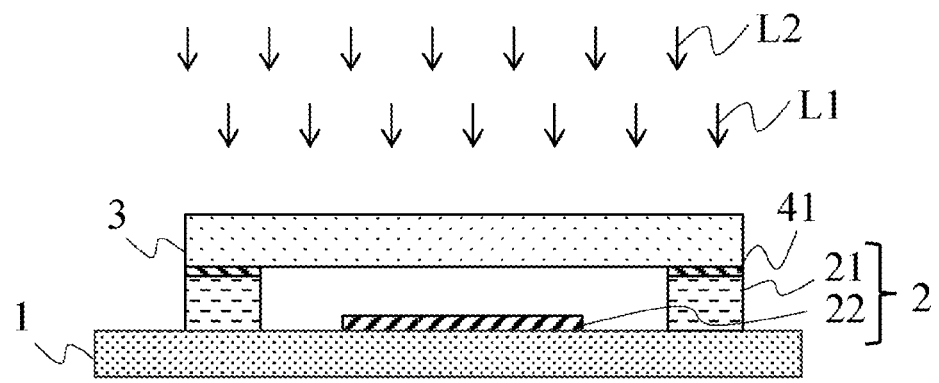
FIG. 3 is a schematic diagram showing a package component according to an embodiment of the present invention.

The relevant derivative embodiments are exemplified and described below. Referring to FIG. 3, in this embodiment, the first filter structure 41 corresponds to the photo-curable adhesive 21 and is disposed on the light exit surface of the cover layer 3. That is, the first filter structure 41 is sandwiched between the cover layer 3 and the base layer 1. For example, the first filter structure 41 can form a ring-shaped coating layer on the perimeter of the light exit surface of the cover layer 3 through, for example, but is not limited to, an evaporation process, but this embodiment is not limited thereto. In brief, the first filter structure 41 is disposed on the perimeter of the cover layer 3, the photo-curable adhesive 21 is disposed on the perimeter of the base layer 1, and the orthogonal projection of the first filter structure 41 onto the base layer 1 roughly overlaps with or at least partially overlaps with the orthogonal projection of the photo-curable adhesive 21 onto the base layer 1. In this way, the first filter structure 41 can allow the curing light L1 to propagate through the cover layer 3 to irradiate the photo-curable adhesive 21 from a roughly orthogonal direction. For example, ultraviolet light (that is, the curing light L1) is vertically incident onto the light entrance surface of the cover layer 3, on which no surface treatment has been performed, and then emerges from the light exit surface of the first filter structure 41 to make the UV curing epoxy cured and connect the cover layer 3 with the base layer 1. As a result, a solid package cavity is formed, and possibility for the package component to be cracked or damaged in the future is thereby reduced. The related optical properties, effects and advantages of the first filter structure 41 for the curing light L1 and the detectable light L2 are described as mentioned above, and details are not described herein again.

Figure 4:
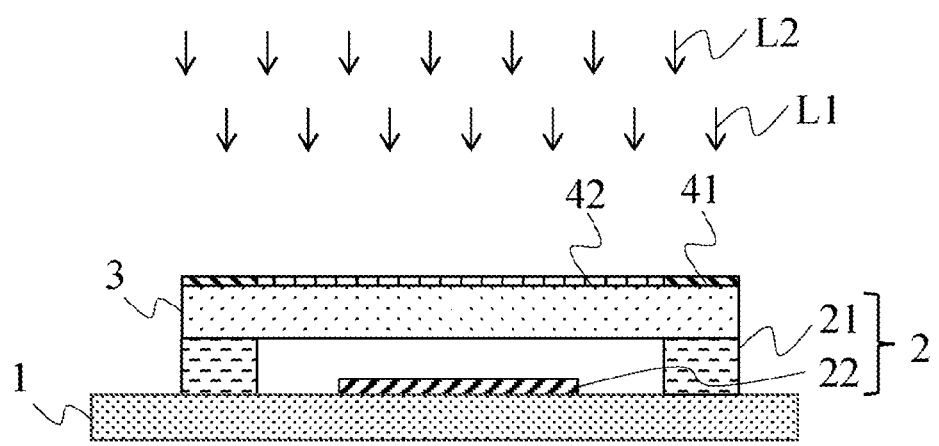
FIG. 4 is a schematic diagram showing a package component according to an embodiment of the present invention.

Referring to FIG. 4, a package component of an embodiment of the present invention includes a base layer 1, a sensing layer 2, a photo-curable adhesive 21, a cover layer 3, a first filter structure 41 and a second filter structure 42. The structural features, interconnection relationship, technical effects, advantages and associated embodiments concerning some components, i.e. the base layer 1, the sensing layer 2, the photo-curable adhesive 21, the cover layer 3 and the first filter structure 41, have been described above. The second filter structure 42 corresponds to the sensing unit 22 and is disposed on a surface of the cover layer 3, and the second filter structure 42 is configured for the detectable light L2 to pass and for reflecting the curing light L1. The detectable light L2 is used to activate the sensing unit 22, and the curing light L1 is used to cure the photo-curable adhesive 21. The detailed description is as follows:

In this embodiment, the second filter structure 42 corresponds to the sensing unit 22 and is disposed on the central area of the light entrance surface of the cover layer 3, and the second filter structure 42 is surrounded by the first filter structure 41. Therefore, an orthogonal projection of the second filter structure 42 onto the base layer 1 does not overlap with an orthogonal projection of the first filter structure 41 onto the base layer 1. For example, the second filter structure 42 can be formed as a coating layer on the central area of the light entrance surface of the cover layer 3 above the sensing unit 22. The coating layer may be formed through, for example, but is not limited to, an evaporation process. The first filter structure 41 is disposed on the perimeter of the light entrance surface of the cover layer 3, but this embodiment is not limited thereto. In other words, the second filter structure 42 is disposed on the central area of the light entrance surface of the cover layer 3, the sensing unit 22 is disposed at the center of the cavity enclosed by the photo-curable adhesive 21. The orthogonal projection of the second filter structure 42 onto the base layer 1 overlaps with or at least partially overlaps with the orthogonal projection of the sensing unit 22 onto the base layer 1. In this way, the second filter structure 42 can allow the detectable light L2 to propagate through the cover layer 3 to irradiate the sensing unit 22 from a roughly orthogonal direction. For example, the second filter structure 42 is a broad-band anti-reflective (BBAR) coating, a near-infrared anti-reflective coating (NIR ARC) or a band pass filter. Visible light (that is, the detectable light L2) is vertically incident onto the light entrance surface of the cover layer 3, and then emerges from the light exit surface of the second filter structure 42, to irradiate the charge-coupled device (that is, the sensing unit 22) for generating an electrical signal, so as to capture visible light images or thermal images outside the package component. In this case, ultraviolet light (that is, the curing light L1) is reflected by the second filter structure 42 to the outside of the package component, to avoid or mitigate the extent that ultraviolet light is incident onto the charge-coupled device inside the package component, which might damage the charge-coupled device.

Specifically, the sensing unit 22 may be a charge-coupled device, and correspondingly, the wavelength of the detectable light L2 falls within visible light band different from that of ultraviolet light corresponding to the curing light L1. Specifically, the second filter structure 42 disposed on the light entrance surface of the cover layer 3 can be configured for the detectable light L2 to pass, so that the detectable light L2 associated with an external image light or heat source can propagate through the second filter structure 42 on the central area of the light entrance surface of the cover layer 3 from a roughly orthogonal direction, as well as irradiate the sensing unit 22. The wavelength (or light frequency) of the detectable light L2 corresponds to the process window of the sensing unit 22. That is, the sensing unit 22 generates an electrical signal once being irradiated by the detectable light L2, so that the sensing unit 22 can capture external sensing images, for example, but is not limited to, visible light images, infrared light images or thermal images. Meanwhile, the second filter structure 42 on the cover layer 3 can reflect light of particular wavelength. For example, when the sensing unit 22 is a charge-coupled device, the second filter structure 42 can reflect ultraviolet light, to reduce the extent that ultraviolet light is orthogonally incident to the sensing unit 22, so as to prevent the sensing unit 22 from degradation.

Figure 5:
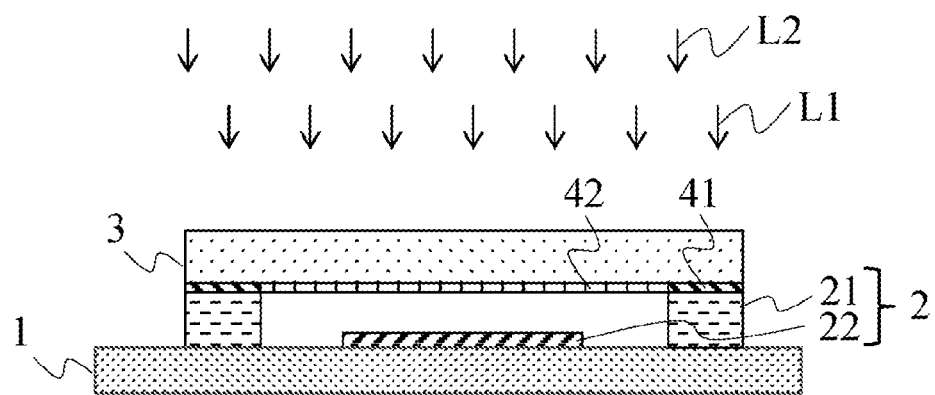
FIG. 5 is a schematic diagram showing a package component according to an embodiment of the present invention.

Referring to FIG. 5, the distinction between the present embodiment and the embodiment illustrated in FIG. 4 is that the first filter structure 41 and the second filter structure 42 are both disposed on the light exit surface of the cover layer 3. That is, the first filter structure 41 and the second filter structure 42 are both sandwiched between the cover layer 3 and the base layer 1.

In this embodiment, the second filter structure 42 corresponds to the sensing unit 22 and is disposed on the central area of the light exit surface of the cover layer 3, and the second filter structure 42 is surrounded by the first filter structure 41. Therefore, the orthogonal projection of the second filter structure 42 onto the base layer 1 does not overlap with the orthogonal projection of the first filter structure 41 onto the base layer. The first filter structure 41 and the second filter structure 42 are both disposed inside the package cavity. The features, interconnection relationship, advantages, effects, and derivative embodiments of the first and second filter structures 41, 42 have been described as mentioned above.

According to the structure of the package component exemplified in the FIG. 4 and FIG. 5, the second filter structure 42 is disposed at an appropriate location of the cover layer 3. The appropriate location means that the orthogonal projection of the second filter structure 42 onto the base layer 1 roughly overlaps with the orthogonal projection of the sensing unit 22 onto the base layer 1, so that the detectable light L2 (such as visible light) can propagate through the cover layer 3 and be incident to the sensing unit 22, and the curing light L1 (such as ultraviolet light) whose wavelength is different from the wavelength of the detectable light L2 is reflected. That is, the second filter structure 42 reflects the curing light L1 so as to prevent the sensing unit 22 from being damaged after being continuously irradiated by the curing light L1. As a result, the advantage and effect of prolonging lifetime of the package component is achieved.

It should be noted that, the first filter structure 41 and the second filter structure 42 are not limited to be co-planar. With a proper condition, the first filter structure 41 can be disposed both on the light entrance surface and the light exit surface of the cover layer 3, and the second filter structure 42 can be disposed at two opposite sides of the cover layer 3. The curing light L1 such as ultraviolet light can still be allowed to irradiate the photo-curable adhesive 21 in order to form a solid package cavity. Therefore, possibility for the package component to be cracked or damaged in the future is lowered. Any person of ordinary skill in the art should understand the foregoing derivative implementation aspects, but this embodiment is not limited thereto.

Based on the above, some embodiments of the present invention provide a package component, where a first filter structure corresponding to a sealing adhesive and disposed on a surface of a cover layer is mainly used. It comes out that a curing light suitable for curing the sealing adhesive can propagate through the first filter structure from the periphery and irradiate the sealing adhesive, and possibility for the package component to be cracked or damaged in the future is lowered. Meanwhile, the first filter structure reflects visible light incident from the periphery, so as to reduce the flare phenomena caused by obliquely incident or reflected light impinging the sensing unit at the center. Herein, the wavelength of the curing light is different from the wavelength of the detectable light. In addition, the second filter structure disposed at the appropriate location of the cover layer is configured for the detectable light to impinge onto the sensing unit, and for reflecting the curing light (such as ultraviolet light), to prevent the sensing unit from being damaged after being continuously irradiated by the curing light. Therefore, the first filter structure and the second filter structure have the advantages and effects of prolonging lifetime of the package component and improving product reliability.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A package component, comprising:
   a base layer;
   a photo-curable adhesive, disposed on the base layer;
   a sensing layer, disposed on the base layer, the sensing layer comprising a sensing unit surrounded by the photo-curable adhesive;
   a cover layer, disposed above the sensing layer and hermetically connected to the base layer through the photo-curable adhesive;
   a first filter structure, corresponding to the photo-curable adhesive, and disposed on a surface of the cover layer, the first filter structure being configured for transmitting a curing light which is used to cure the photo-curable adhesive, and for reflecting a detectable light which is to be sensed by the sensing unit, wherein a wavelength of the curing light is different from a wavelength of the detectable light; and
   a second filter structure, corresponding to the sensing unit, and disposed on a surface of the cover layer, the second filter structure being configured for transmitting the detectable light and for reflecting the curing light.

2. The package component according to claim 1, wherein the photo-curable adhesive is an ultraviolet-curable adhesive, and the curing light is an ultraviolet light.

3. The package component according to claim 1, wherein a transmittance of the curing light relative to the first filter structure is greater than 90%.

4. The package component according to claim 1, wherein a reflectance of the detectable light relative to the first filter structure is greater than 90%.

5. The package component according to claim 1, wherein the detectable light is a visible light.

6. The package component according to claim 1, wherein the second filter structure is surrounded by the first filter structure.

7. The package component according to claim 1, wherein an orthogonal projection of the second filter structure does not overlap with an orthogonal projection of the first filter structure.

8. The package component according to claim 1, wherein the second filter structure is a broad-band anti-reflective (BBAR) coating, a near-infrared anti-reflective coating (NIR ARC) or a band pass filter.

9. The package component according to claim 1, wherein the cover layer is a glass substrate.

* * * * *